(12) United States Patent
Abe

(10) Patent No.: US 12,248,026 B2
(45) Date of Patent: Mar. 11, 2025

(54) IMPEDANCE MEASUREMENT SYSTEM

(71) Applicant: SUBARU CORPORATION, Tokyo (JP)

(72) Inventor: Tomohiro Abe, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 301 days.

(21) Appl. No.: 17/870,538

(22) Filed: Jul. 21, 2022

(65) Prior Publication Data

US 2023/0075287 A1 Mar. 9, 2023

(30) Foreign Application Priority Data

Sep. 7, 2021 (JP) .................................. 2021-145160

(51) Int. Cl.
*G01R 31/389* (2019.01)
*G01R 31/36* (2020.01)

(52) U.S. Cl.
CPC ....... *G01R 31/389* (2019.01); *G01R 31/3648* (2013.01)

(58) Field of Classification Search
CPC ............ H01M 8/04589; H01M 8/0488; G01R 31/389; G01R 31/3648
See application file for complete search history.

(56) References Cited

U.S. PATENT DOCUMENTS

| | | | | |
|---|---|---|---|---|
| 8,241,802 | B2* | 8/2012 | Manabe | H01M 8/0488 |
| | | | | 702/65 |
| 11,088,386 | B2* | 8/2021 | Mizutani | H01M 8/04649 |
| 2011/0269046 | A1 | 11/2011 | Suematsu | |
| 2013/0057292 | A1 | 3/2013 | Hasegawa et al. | |
| 2018/0294494 | A1* | 10/2018 | Mizutani | H01M 8/04649 |

FOREIGN PATENT DOCUMENTS

JP 2010-165463 A 7/2010
JP 2011-216429 A 10/2011

* cited by examiner

*Primary Examiner* — Lam S Nguyen
(74) *Attorney, Agent, or Firm* — McGinn Intellectual Property Law Group, PLLC

(57) ABSTRACT

An impedance measurement system configured to measure impedance of a measurement target capable of supplying power to an electrical load device includes one or more processors and one or more memories. The one or more processors are configured to perform a process including: acquiring data about output power from the measurement target when an alternating current signal of at least one frequency is superimposed on the output power; calculating impedance at the at least one frequency with data about an exclusion period when waveform distortion of the output power is detected being excluded; and in a case where how many times the data about the exclusion period is excluded at a certain frequency is greater than or equal to a predetermined threshold value, changing of a setting of an operating condition of an electronic device coupled to the measurement target or the electrical load device.

5 Claims, 5 Drawing Sheets

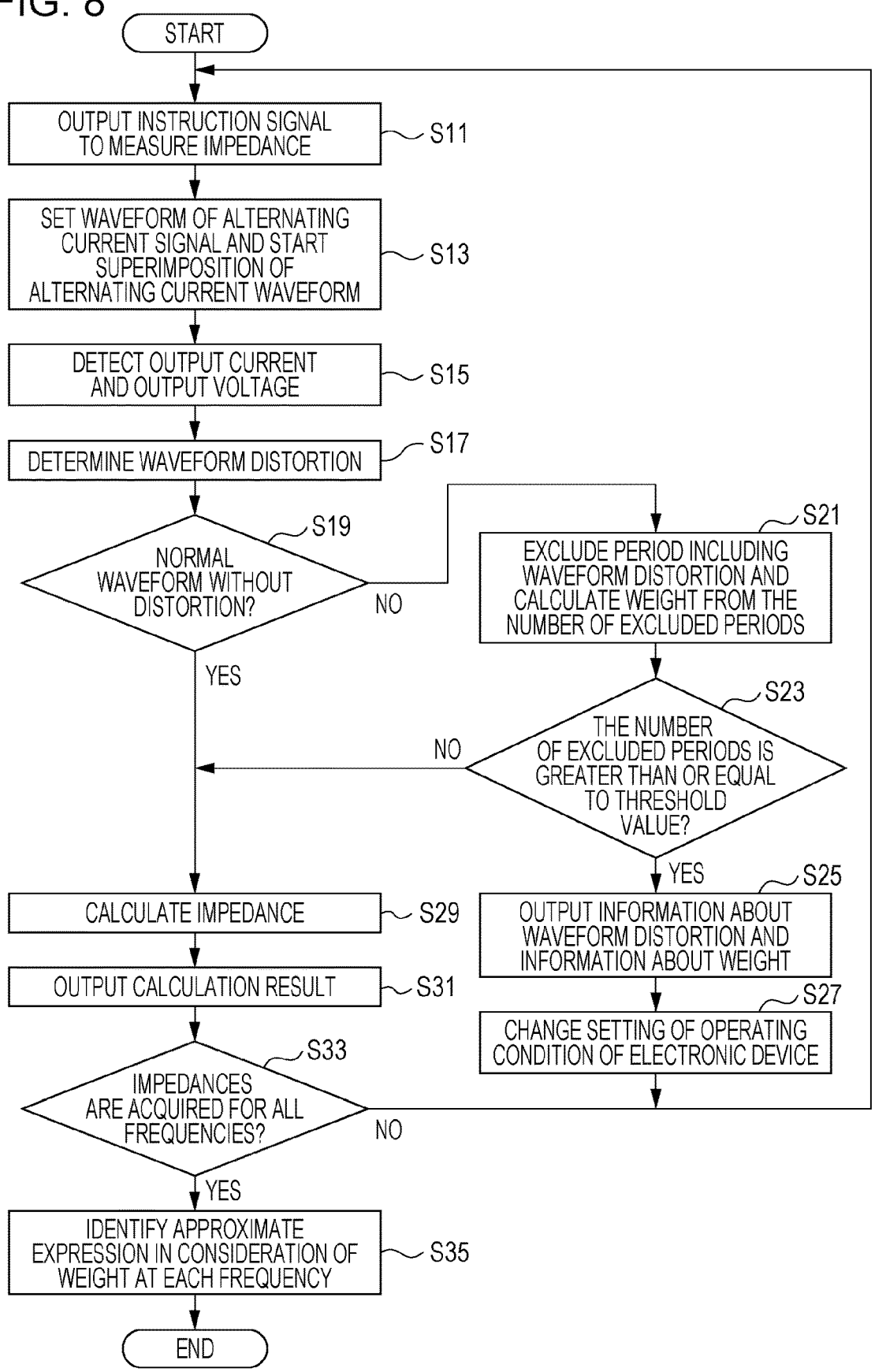

IMPEDANCE MEASUREMENT SYSTEM

CROSS-REFERENCE TO RELATED APPLICATIONS

The present application claims priority from Japanese Patent Application No. 2021-145160 filed on Sep. 7, 2021, the entire contents of which are hereby incorporated by reference.

BACKGROUND

The disclosure relates to an impedance measurement system.

Electrochemical impedance spectroscopy is known as a method of diagnosing the internal state of a power generation module, such as a polymer electrolyte fuel cell (PEFC), or a secondary battery, such as a lithium ion battery (LiB). In the electrochemical impedance spectroscopy, a process is performed to calculate the impedance based on data about output power from a measurement target, such as the power generation module or the secondary battery, when an alternating current signal is superimposed on the output power to cause the measurement target to output power. The use of the electrochemical impedance spectroscopy enables the internal state of the measurement target to be diagnosed based on the impedance at the frequency of the alternating current signal to be superimposed.

For example, Japanese Unexamined Patent Application Publication (JP-A) No. 2010-165463 proposes a fuel cell system that accurately determines the degree of dryness in a fuel cell using the electrochemical impedance spectroscopy. In one example, the fuel cell system is disclosed in JP-A No. 2010-165463, in which the impedance of the fuel cell is calculated, high-frequency impedance, which is the impedance in a high-frequency domain, and low-frequency impedance, which is the impedance in a low-frequency domain, are extracted from the calculated impedance, differential impedance is calculated by subtracting the high-frequency impedance from the low-frequency impedance, the moisture content of an electrolyte membrane is calculated using the high-frequency impedance, and the moisture content of a catalytic layer is calculated using the differential impedance.

JP-A No. 2011-216429 proposes a fuel cell system that improves the impedance measurement performance of a fuel cell in the fuel cell system including a multi-phase voltage conversion apparatus. In one example, the fuel cell system is disclosed in JP-A No. 2011-216429, in which a control waveform for impedance measurement is superimposed on voltage indicating output target voltage of the multi-phase voltage conversion apparatus to generate a control signal for controlling each phase of the multi-phase voltage conversion apparatus, the control signals of an N-number phases are sequentially supplied to the multi-phase voltage conversion apparatus with a predetermined phase difference, the current and the voltage of the fuel cell are measured on a cycle corresponding to the N-number predetermined sampling frequencies, which have the same phase difference as the predetermined phase difference, and the impedance of the fuel cell is calculated using the measured current and voltage.

SUMMARY

An aspect of the disclosure provides an impedance measurement system configured to measure impedance of a measurement target capable of supplying power to an electrical load device. The impedance measurement system includes one or more processors and one or more memories coupled to the one or more processors so as to be capable of communicating with the one or more processors. The one or more processors are configured to perform a process including: acquiring data about output power from the measurement target when an alternating current signal of at least one frequency is superimposed on the output power; calculating impedance at the at least one frequency with data about an exclusion period in which waveform distortion of the output power is detected being excluded; and in a case where how many times the data about the exclusion period is excluded at a certain frequency is greater than or equal to a predetermined threshold value, changing a setting of an operating condition of an electronic device coupled to the measurement target or the electrical load device to measure the impedance.

An aspect of the disclosure provides an impedance measurement system configured to measure impedance of a measurement target capable of supplying power to an electrical load device based on output power from the measurement target. The output power is measured when an alternating current signal of at least one frequency is superimposed on the output power. The impedance measurement system includes a superimposed signal generator, an impedance calculator, and an auxiliary machine controller. The superimposed signal generator is configured to superimpose the alternating current signal. The impedance calculator is configured to calculate the impedance of the at least one frequency with data about an exclusion period in which waveform distortion of the output power is detected being excluded. The auxiliary machine controller is configured to, in a case where how many times the data about the exclusion period is excluded at a certain frequency is greater than or equal to a predetermined threshold value, change a setting of an operating condition of an electronic device coupled to the measurement target or the electrical load device.

BRIEF DESCRIPTION OF THE DRAWINGS

The accompanying drawings are included to provide a further understanding of the disclosure and are incorporated in and constitute a part of this specification. The drawings illustrate an example embodiment and, together with the specification, serve to describe the principles of the disclosure.

FIG. 8 is a flowchart illustrating an impedance measuring process performed by the impedance measurement system according to the embodiment.

DETAILED DESCRIPTION

In a power system which includes, for example, a fuel cell or a secondary battery capable of supplying power to a power load device and which is typified by a fuel cell system, such as a fuel cell automobile, an electronic device that consumes the power is further connected to a measurement target, such as the fuel cell or the secondary battery, or the power load device. If the power consumption by the electronic device is greatly varied in measurement of impedance, the power system has room for improvement in that noise caused by the electronic device may be superimposed on the waveform of output power from the measurement target to cause waveform distortion of the impedance to be measured.

In order to achieve the above improvement, it is desirable to provide an impedance measurement system capable of improving the measurement precision of the impedance of a measurement target, such as a power generation module or a secondary battery.

In the following, an embodiment of the disclosure is described in detail with reference to the accompanying drawings. Note that the following description is directed to an illustrative example of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiment which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same numerals to avoid any redundant description.

<1. Entire Configuration of Fuel Cell System>

An example of an impedance measurement system according to an embodiment of the disclosure will now be described. Although an example is described in the following embodiment in which the impedance measurement system is applied to a fuel cell system mounted on a fuel cell vehicle, the impedance measurement system is not limitedly applied to the fuel cell system.

Figure 1:
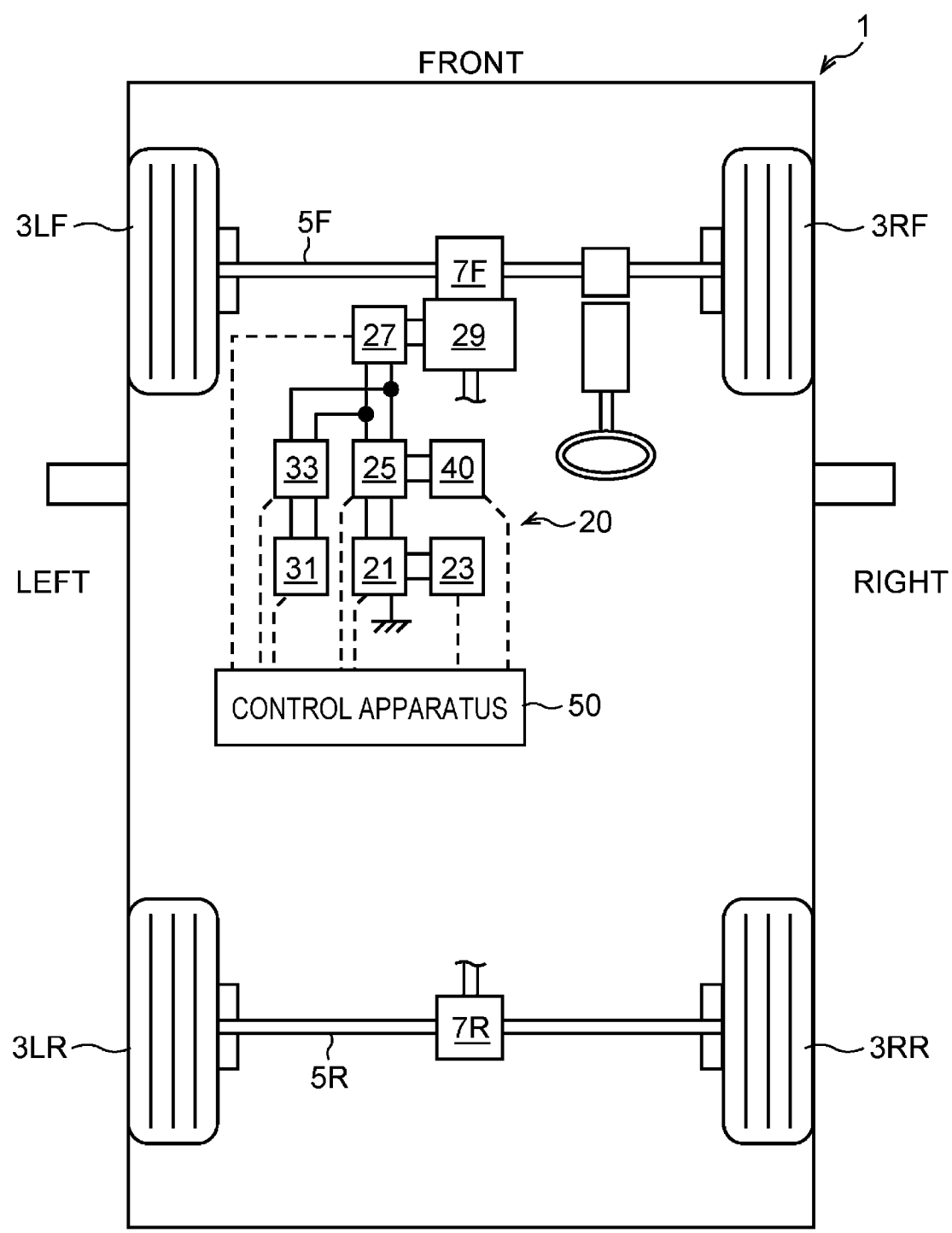
FIG. 1 is a schematic diagram illustrating an example of a vehicle including a fuel cell system to which an impedance measurement system according to an embodiment of the disclosure is applicable.
Figure 2:
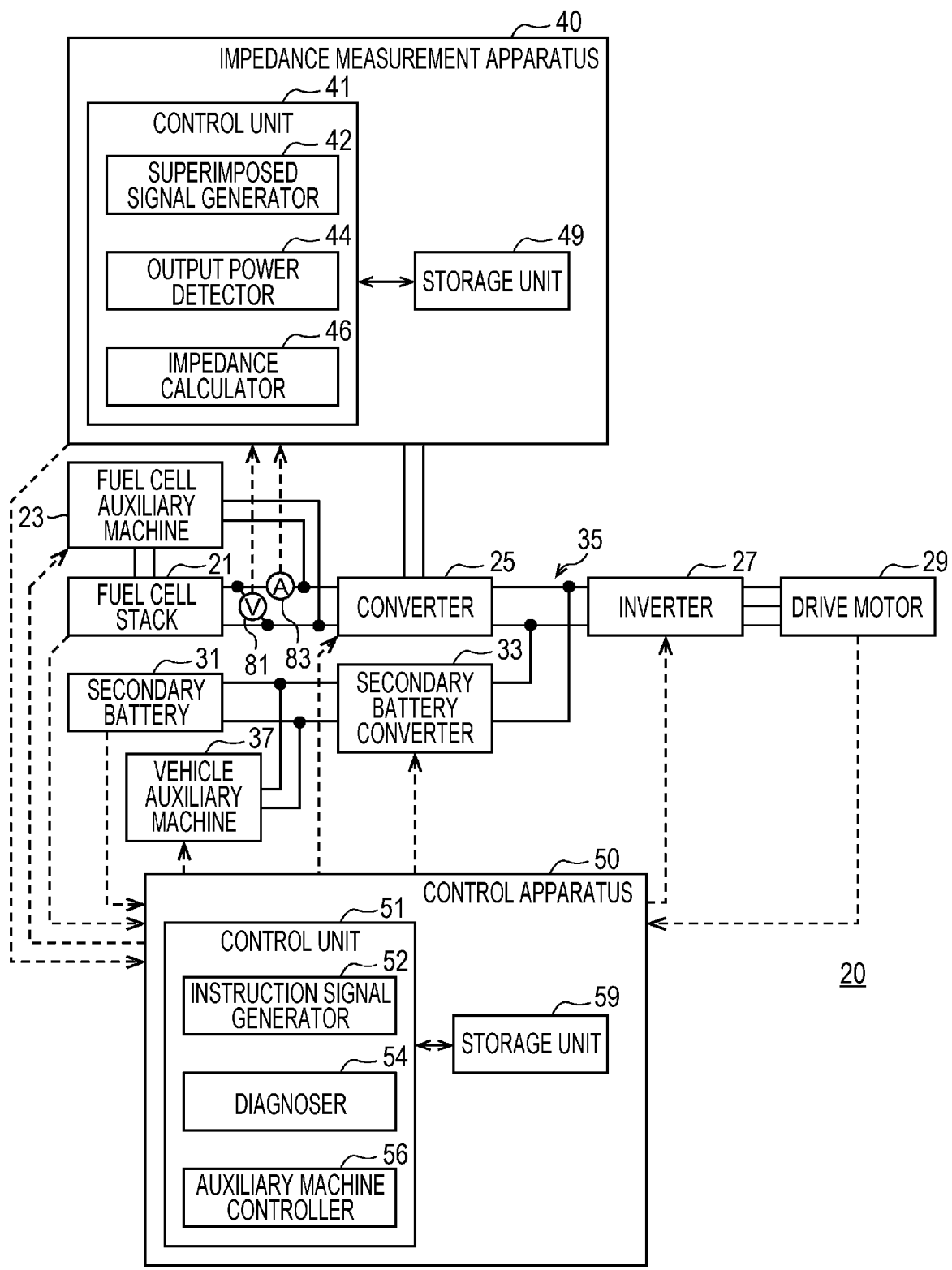
FIG. 2 is a block diagram illustrating an example of the configuration of the fuel cell system to which the impedance measurement system according to the embodiment is applied.

FIG. 1 is a schematic diagram illustrating an example of a vehicle 1 having a fuel cell system 20 mounted therein. FIG. 2 is a block diagram illustrating an example of the configuration of the fuel cell system 20. Among the components in an impedance measurement apparatus 40 and a control apparatus 50, functional components related to a process to measure the impedance of a fuel cell stack 21 are illustrated in FIG. 2.

The vehicle 1 illustrated in FIG. 1 is configured as a four-wheel drive fuel cell vehicle that transmits driving torque output from a drive motor 29, which generates the driving torque of the vehicle, to a left front wheel 3LF, a right front wheel 3RF, a left rear wheel 3LR, and a right rear wheel 3RR (hereinafter collectively referred to as wheels 3 when the left front wheel 3LF, the right front wheel 3RF, the left front wheel 3LF, and the right rear wheel 3RR are not specially discriminated). The drive motor 29 outputs the driving torque, which is transmitted to a front wheel drive shaft 5F and a rear wheel drive shaft 5R via a transmission (not illustrated), a front wheel differential mechanism 7F, and a rear wheel differential mechanism 7R.

The vehicle 1 may be an electric automobile including two drive motors of a front wheel drive motor and a rear wheel drive motor or may be an electric automobile including drive motors corresponding to the respective wheels 3.

The fuel cell system 20 includes the fuel cell stack 21, a fuel cell auxiliary machine 23, a converter 25, an inverter 27, the drive motor 29, a secondary battery 31, a secondary battery converter 33, the impedance measurement apparatus 40, and the control apparatus 50.

The drive motor 29 is a three-phase alternating current motor including coils of three phases of a u phase, a v phase, and a w phase. The drive motor 29 is driven with three-phase alternating current power supplied from the fuel cell system 20.

The fuel cell stack 21 is configured as, for example, a solid polymer electrolyte type fuel cell and has a stacked structure in which multiple fuel cells are stacked. Each fuel cell includes a membrane electrode assembly (MEA) including a hydrogen electrode and an oxygen electrode that are provided on each side of an electrolyte membrane formed of an ion exchange membrane and a gas diffusion layer that is formed on the hydrogen electrode and the oxygen electrode. The fuel cell includes a pair of separators disposed so as to sandwich the MEA. Power generation is performed through electrochemical reaction of hydrogen gas, which is supplied to a hydrogen gas flow path formed in the hydrogen electrode, and the air, which is supplied to an air flow path formed in the oxygen electrode. The fuel cell stack 21 supplies direct-current power that is generated to the converter 25.

The fuel cell auxiliary machine 23 includes devices that adjust the pressures and the flow rates of the hydrogen gas (fuel gas) and the air (oxidation gas), which are to be supplied to the fuel cell stack 21. For example, the fuel cell auxiliary machine 23 includes a pressure reducing valve, a back-pressure control valve, and a hydrogen circulation pump as the devices that adjust the pressure and the flow rate of the hydrogen gas to be supplied to the fuel cell stack 21. The pressure reducing valve reduces the pressure of the hydrogen gas in a high-pressure hydrogen tank to supply the hydrogen gas having the reduced pressure to the fuel cell stack 21. The back-pressure control valve adjusts the flow rate of hydrogen off-gas discharged from the fuel cell stack 21 to adjust the pressure of the hydrogen gas in the fuel cell stack 21. The hydrogen circulation pump supplies the hydrogen off-gas to the fuel cell stack 21 again.

The fuel cell auxiliary machine 23 includes an inverter for a compressor and a back-pressure control valve as the devices that adjust the pressure and the flow rate of the air to be supplied to the fuel cell stack 21. The inverter for a compressor controls the output from the compressor to adjust the flow rate of the air to be supplied to the fuel cell stack 21. The back-pressure control valve adjusts the flow rate of oxidation off-gas discharged from the fuel cell stack 21 to adjust the pressure of the air in the fuel cell stack 21.

The fuel cell auxiliary machine 23 is an electronic device that operates in response to supply of the direct-current power from the fuel cell stack 21. Driving of the fuel cell auxiliary machine 23 is controlled by the control apparatus 50. The fuel cell auxiliary machine 23 for driving the fuel cell stack 21 is not limited to the above example and may include another device. For example, the fuel cell auxiliary machine 23 may include a cooling water circulation pump that circulates cooling water for cooling the fuel cell stack 21.

The converter 25 is configured as a direct-current (DC)-DC converter that converts the direct-current power supplied from the fuel cell stack 21 to the direct-current power of a desired level to supply the direct-current power converted into the desired level to the inverter 27. The converter 25 is one aspect of an electrical load device that receives the supply of the power from the fuel cell stack 21, which serves as the power generation module. The converter 25 includes a chopper circuit. For example, the converter 25 increases or decreases the voltage of the direct-current power supplied from the fuel cell stack 21 in response to operation of two switching elements in the chopper circuit to supply the direct-current power having the increased or decreased voltage to the inverter 27. Driving of the switching elements in the converter 25 is controlled by the control apparatus 50.

The inverter 27 converts the direct-current power supplied from the converter 25 into the three-phase alternating current power to supply the three-phase alternating current power to the drive motor 29. The inverter 27 includes arm circuits (not illustrated) corresponding to the coils of the u phase, the v phase, and the w phase of the drive motor 29. Each arm circuit includes an upper arm electrically connected to the positive electrode side of the fuel cell stack 21 and a lower arm electrically connected to the negative electrode side of the fuel cell stack 21. Each of the upper arm and the lower arm in each arm circuit includes a switching element to which a diode is electrically anti-parallel connected. For example, a metal oxide semiconductor field effect transistor (MOSFET) or an insulated gate bipolar transistor (IGBT) is used as the switching element. Each of the coils of u phase, the v phase, and the w phase of the drive motor 29 is electrically connected to an interface between the upper arm and the lower arm of each arm circuit.

The inverter 27 causes regeneration by the drive motor 29 during deceleration of the vehicle 1, converts the generated three-phase alternating current power into the direct-current power, and supplies the direct-current power to a direct-current stage 35. Driving of the switching elements provided in each arm circuit of the inverter 27 is controlled by the control apparatus 50. Driving and regeneration by the drive motor 29 is controlled in the above manner.

The secondary battery 31 is connected to the direct-current stage 35 with which the converter 25 is connected the inverter 27 via the secondary battery converter 33. The secondary battery 31 is configured as a battery capable of charge and discharge, such as a lithium ion battery or a nickel hydrogen battery. The secondary battery 31 accumulates excess power resulting from exclusion of the power to be supplied to the drive motor 29 from the power generated in the fuel cell stack 21. In addition, the secondary battery 31 accumulates the power generated through the regeneration by the drive motor 29. The secondary battery 31 supplies the accumulated power to a vehicle auxiliary machine 37. The secondary battery 31 may be capable of supplying the accumulated power to the drive motor 29.

The secondary battery converter 33 adjusts the voltage of the power generated by the fuel cell stack 21, which is supplied to the direct-current stage 35 via the converter 25, and the voltage of the regeneration power by the drive motor 29, which is supplied to the direct-current stage 35 via the inverter 27, to charge the secondary battery 31 with the power generated by the fuel cell stack 21 and the regeneration power by the drive motor 29. In other words, the secondary battery converter 33 is configured as a DC-DC converter. The secondary battery converter 33 may be configured so as to be capable of adjusting the voltage of the power output from the secondary battery 31 to supply the power having the adjusted voltage to the inverter 27. The secondary battery converter 33 includes a chopper circuit. For example, in response to operation of two switching elements in the chopper circuit, the secondary battery converter 33 increases or decreases the voltage of the power at the direct-current stage 35 to supply the power having the increased or decreased voltage to the secondary battery 31 or increases or decreases the voltage of the output power from the secondary battery 31 to supply the power having the increased or decreased voltage to the direct-current stage 35. Driving of the switching elements in the secondary battery converter 33 is controlled by the control apparatus 50.

The vehicle auxiliary machine 37 includes various electronic devices provided in the vehicle 1. Although, for example, an air conditioning apparatus, a lighting apparatus, and an acoustic apparatus are exemplified as the vehicle auxiliary machine 37, other various electronic devices are included in the vehicle auxiliary machine 37. The vehicle auxiliary machine 37 operates in response to supply of the direct-current power output from the secondary battery 31. The vehicle auxiliary machine 37 may receive supply of power the voltage of which is decreased via a step-down converter (not illustrated). In this case, the vehicle auxiliary machine 37 may include an auxiliary machine battery having rated voltage lower than the rated voltage of the secondary battery 31.

The control apparatus 50 performs a process to control the power generation in the fuel cell system 20. For example, the control apparatus 50 calculates used power based on information about the amount of operation by an accelerator during manual driving, information about used acceleration during automated driving, or the like. The control apparatus 50 controls the driving of the fuel cell auxiliary machine 23 based on the used power to adjust the amounts of supply of the hydrogen gas and the air to the fuel cell stack 21. The control apparatus 50 controls the driving of the converter 25 to control output voltage and output current from the fuel cell stack 21. If the amount of power generated by the fuel cell stack 21 exceeds the used power, the control apparatus 50 controls the driving of the secondary battery converter 33 to decrease the voltage of the excess power, in the power supplied from the converter 25 to the direct-current stage 35, and charges the secondary battery 31 with the power having the decreased voltage. If the amount of power generated by the fuel cell stack 21 is smaller than the used power, the control apparatus 50 controls the driving of the secondary battery converter 33 to increase the voltage of the output power from the secondary battery 31 and supplies shortfall power to the direct-current stage 35.

The control apparatus 50 controls the driving of the inverter 27 to control the output torque and the rotation speed of the drive motor 29 so as to realize the acceleration used in the vehicle 1. In addition, the control apparatus 50 controls the regeneration by the drive motor 29 during deceleration of the vehicle 1. In one example, the control apparatus 50 controls the driving of the inverter 27 in accordance with target regeneration torque that is set based on used braking torque during deceleration of the vehicle 1 to cause the regeneration by the drive motor 29.

The control apparatus 50 controls the driving of the secondary battery converter 33 to charge the secondary battery 31 with the power generated through the regeneration by the drive motor 29.

The control apparatus 50 performs a process to measure the impedance of the fuel cell stack 21 and a process to diagnose the state of the fuel cell stack 21 in cooperation with the impedance measurement apparatus 40. Among the components in the impedance measurement apparatus 40 and the control apparatus 50, points related to the process to measure the impedance of the fuel cell stack 21 and the process to diagnose the state of the fuel cell stack 21 will now be described in detail.

<2. Impedance Measurement Apparatus and Control Apparatus>

(2.1 Outline)

The processes performed by the control apparatus 50 and the impedance measurement apparatus 40 will now be schematically described.

In the fuel cell system 20 of the present embodiment, the control apparatus 50 transmits an instruction signal for acquiring the impedance of the fuel cell stack 21 to the impedance measurement apparatus 40. In one example, the control apparatus 50 transmits the instruction signal indicating the frequency at which the impedance is to be measured to the impedance measurement apparatus 40.

The impedance measurement apparatus 40 performs the process to measure the impedance of the fuel cell stack 21. The impedance measurement apparatus 40 generates an alternating current signal for impedance measurement based on the instruction signal transmitted from the control apparatus 50 and supplies the generated alternating current signal to the converter 25 to superimpose the alternating current signal of a predetermined frequency on the power output from the fuel cell stack 21. In addition, the impedance measurement apparatus 40 detects the output power from the fuel cell stack 21 when the alternating current signal is superimposed on the output power from the fuel cell stack 21 to calculate the impedance of the fuel cell stack 21 based on data about the detected output power.

In the present embodiment, the impedance measurement apparatus 40 excludes data on a period in which waveform distortion is detected from the data about the waveform of the acquired output power to calculate the impedance at each frequency. The impedance measurement apparatus 40 transmits information about the calculated impedance, information about the waveform distortion, and information about the accuracy of the impedance at each frequency, which is calculated based on the waveform distortion (hereinafter also referred to as weight information) to the control apparatus 50.

The control apparatus 50 acquires the information about the calculated impedance, the information about the waveform distortion, and the weight information about the calculated impedance at each frequency from the impedance measurement apparatus 40 to diagnose the state of the fuel cell stack 21.

(2.2 Impedance Measurement Apparatus)

The impedance measurement apparatus 40 includes a control unit 41 and a storage unit 49. The control unit 41 includes one or more processors, such as a central processing unit (CPU) or a micro processing unit (MPU), and an electric circuit. Part or the whole of the control unit 41 may be composed of an updatable component, such as firmware, or may be a program module that is executed in response to an instruction from the CPU or the like.

The storage unit 49 is connected to the processor so as to be capable of communicating with the processor and includes a memory storing computer programs executed by the processor, control parameters, acquired information, and so on. The storage unit 49 may include memory devices, such as a random access memory (RAM) and a read only memory (ROM), and may include storages, such as a compact disk read only memory (CD-ROM) and a storage device.

The impedance measurement apparatus 40 is connected to the control apparatus 50 so as to be capable of communicating with the control apparatus 50 via a communication tool, such as a controller area network (CAN), or a dedicated line. In addition, the impedance measurement apparatus 40 is configured so as to be capable of acquiring sensor signals from a voltage sensor 81 and a current sensor 83. The voltage sensor 81 detects the output voltage from the fuel cell stack 21. The current sensor 83 detects the output current from the fuel cell stack 21.

The control unit 41 includes a superimposed signal generator 42, an output power detector 44, and an impedance calculator 46. Part or all of the superimposed signal generator 42, the output power detector 44, and the impedance calculator 46 are functions realized by the execution of the computer programs by the processor. Alternatively, part or all of the superimposed signal generator 42, the output power detector 44, and the impedance calculator 46 may be composed of hardware.

The superimposed signal generator 42 sets the waveform of the alternating current signal for impedance measurement to be superimposed on the output power from the fuel cell stack 21 based on the instruction signal from the control apparatus 50 to supply the alternating current signal having the set waveform to the converter 25. In the present embodiment, the superimposed signal generator 42 sets the frequency and the amplitude of sine waves of superimposed current to be superimposed on the output power based on the instruction signal transmitted from the control apparatus 50. The frequency of the superimposed current is set based on information about the frequency included in the instruction signal. The amplitude of the superimposed current may be set to an appropriate value depending on the specifications and so on of the fuel cell system 20. Alternatively, a rectangular-wave signal or an M-sequence signal, which is generated through superimposition of signals having the waveforms of multiple frequencies, may be used as the signal for impedance measurement to be superimposed on the output signal from the fuel cell stack 21. The superimposed signal generator 42 supplies the alternating current signal having the frequency and the amplitude that are set to the converter 25. The converter 25 operates the switching elements based in the input alternating current signal and superimposes an alternating current waveform on the output power from the fuel cell stack 21.

The alternating current signal to be superimposed on the output power from the fuel cell stack 21 may be alternating current voltage, instead of the alternating current.

The output power detector 44 performs a process to detect current (output current) I and voltage (output voltage) V of the output power from the fuel cell stack 21, which are output while the alternating current waveform is being superimposed on the output power from the fuel cell stack 21, based on the sensor signals output from the voltage sensor 81 and the current sensor 83. Data about the output current I and the output voltage V is detected on a predetermined sampling cycle and is recorded as the alternating current waveform and an alternating current voltage waveform on which the alternating current signal for impedance measurement is superimposed.

The impedance calculator 46 performs a process to calculate the impedance of the fuel cell stack 21 based on the alternating current waveform and the alternating current voltage waveform that are recorded. The output voltage V, the output current I, and impedance Z of the fuel cell stack 21 when the alternating current signal is superimposed on the output power from the fuel cell stack 21 meet the relationship represented by the following equations:

$$V = V0 \exp j(\omega t + \varphi)$$
$$I = I0 \exp j\omega t$$
$$Z = V/I = (V0/I0) \exp j\varphi = Z' + jZ''$$

where V0: amplitude of output voltage, 10: amplitude of output current, ω: each frequency, φ: initial phase, Z': resistance component (real number component) Z'': reactance component (imaginary component), j: imaginary unit, t: time Based on the above equations, the impedance calculator 46 calculates the impedance at each frequency from the amplitudes of the alternating current waveform and the alternating current voltage waveform and the phase difference between the alternating current waveform and the alternating current voltage waveform. Alternatively, when the rectangular-wave signal or the M-sequence signal, which is generated through superimposition of signals having the waveforms of multiple frequencies, is used as the signal for impedance measurement to be superimposed on the output signal from the fuel cell stack 21, the impedance calculator 46 may separate the duplicated signals through fast Fourier transform (FFT) analysis of the alternating current waveform and the alternating current voltage waveform to calculate the impedance at each frequency. The impedance calculator 46 uses the average of the impedances calculated from the amplitudes of the respective periods of the alternating current waveform and the alternating current voltage waveform and the phase difference between the alternating current waveform and the alternating current voltage waveform, for each of one or multiple frequencies, as the impedance at each frequency. The amplitude of each period of the alternating current waveform and the alternating current voltage waveform is capable of being calculated as, for example, the maximum value of the output current I or the output voltage V in each period and the difference between the maximum values.

Figure 3:
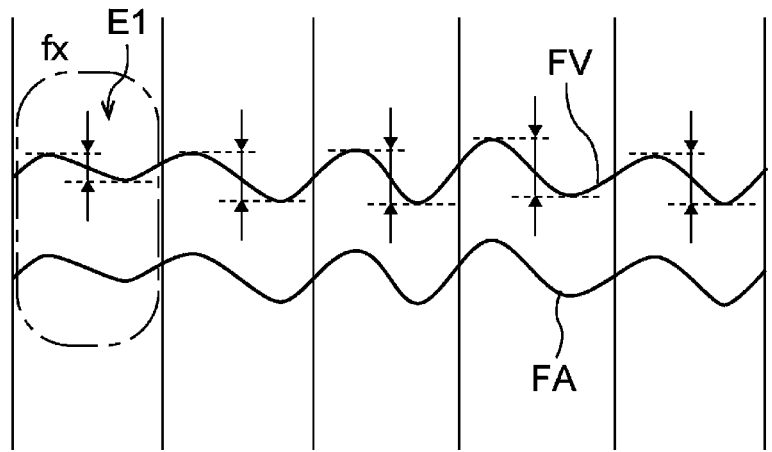
FIG. 3 is a diagram for describing decrease in amplitude in an aspect of waveform distortion.

At this time, the impedance calculator 46 determines whether the waveform distortion exists in at least one of the alternating current waveform or the alternating current voltage waveform. The waveform distortion is exemplified by distortion E1 caused by decrease in amplitude, illustrated in FIG. 3, and distortion E2 caused by shift in phase in one period at the amplitude, illustrated in FIG. 4. The distortion E1 caused by the decrease in amplitude, illustrated in FIG. 3, is caused by the decrease in the amplitude in a certain period fx of alternating current waveform FA itself that is superimposed to decrease the amplitude in the certain period fx of alternating current voltage waveform FV. The waveform distortion E1 is considered to be caused by an influence of noise or the like in a process in which the alternating current signal to be superimposed is output.

Figure 4:
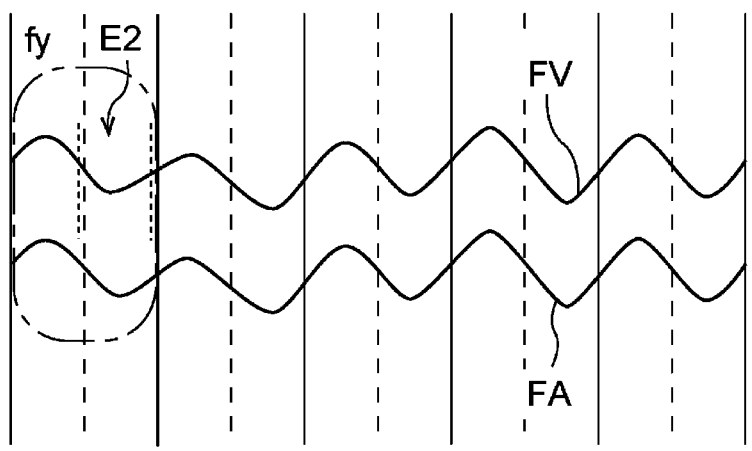
FIG. 4 is a diagram for describing shift in phase in one period at the amplitude in an aspect of the waveform distortion.

The distortion E2 caused by the shift in phase in the period at the amplitude, illustrated in FIG. 4, is caused by a shift between the phase of the alternating current waveform FA superimposed in a certain period fy and the phase of the alternating current voltage waveform FV. The waveform distortion E2 is considered to be caused by an influence of noise or the like in the same period as that of the frequency at which the impedance is measured. The shift in phase in the period at the amplitude is capable of being detected by, for example, comparison between the position of an inflection point of the alternating current waveform FA and the position of the inflection point of the alternating current voltage waveform FV. The waveform distortion is not limited to the above examples and another kind of distortion may be detectable.

When the waveform distortion exists, the impedance calculator 46 calculates the impedance with data corresponding to one period including the waveform distortion being excluded. Although the data about the period may be excluded when the waveform distortion exists in both the alternating current waveform and the alternating current voltage waveform, the data about the period is desirably excluded when the waveform distortion exists in at least one of the alternating current waveform or the alternating current voltage waveform in order to improve the accuracy of the impedance to be calculated.

In addition, the impedance calculator 46 performs a process to perform the FFT analysis of the data about the waveform in the period in which the waveform distortion is detected to identify the frequency included in the waveform. As a result, the frequency of electromagnetic wave noise causing the waveform distortion is identified. The impedance calculator 46 recodes the identified frequency.

The impedance calculator 46 records the number of the excluded periods as the information (weight information) about the accuracy of the calculated impedance. For example, when data about five periods, among 100 periods, is excluded, the weight is recorded as 95(=100–5). The impedance calculator 46 transmits the information about the calculated impedance, the information about the waveform distortion, and the weight information to the control apparatus 50. The information about the waveform distortion includes information about the frequency of the noise included in the data about the period in which the waveform distortion is detected.

The impedance calculator 46 may determine that the accuracy of the calculated impedance is low if the number of the excluded periods is greater than or equal to a predetermined threshold value, that is, if the weight is lower than or equal to a predetermined threshold value and may transmit the information about the waveform distortion and the weight information to the control apparatus 50 without the calculation of the impedance.

(2.3 Control Apparatus)

The control apparatus 50 includes a control unit 51 and a storage unit 59. The control unit 51 includes one or more processors, such as a CPU or an MPU. Part or the whole of the control unit 51 may be composed of an updatable component, such as firmware, or may be a program module or the like that is executed in response to an instruction from the CPU or the like.

The storage unit 59 is connected to the processor so as to be capable of communicating with the processor and includes a memory storing computer programs executed by the processor, control parameters, acquired information, and so on. The storage unit 59 may include memory devices, such as a RAM and a ROM, and may include storages, such as a CD-ROM and a storage device.

The control apparatus 50 is connected to the impedance measurement apparatus 40 so as to be capable of communicating with the impedance measurement apparatus 40 via a communication tool, such as a CAN, or a dedicated line. The control apparatus 50 is configured so as to be capable of transmitting the instruction signal to the impedance measurement apparatus 40 and acquiring the information transmitted from the impedance measurement apparatus 40.

The control unit 51 includes an instruction signal generator 52, a diagnoser 54, and an auxiliary machine controller 56. Part or all of the instruction signal generator 52, the diagnoser 54, and the auxiliary machine controller 56 may be functions realized by the execution of the computer programs by the processor. Alternatively, part or all of the instruction signal generator 52, the diagnoser 54, and the auxiliary machine controller 56 may be composed of hardware.

The instruction signal generator 52 performs a process to set the frequency at which the impedance is to be measured and to transmit the instruction signal to the impedance measurement apparatus 40. The frequency to be set is the frequency of the alternating current signal to be superimposed on the output power from the fuel cell stack 21 and is set depending on the objective of the diagnosis of the fuel cell stack 21. For example, setting the frequency to a high-frequency domain enables the wet state of the MEA in the fuel cell stack 21 to be diagnosed. Setting the frequency to a low-frequency domain enables the supply state of the gas to be diagnosed. The supply state of the gas indicates, for example, whether the fuel gas, such as the hydrogen gas, or the air is sufficiently supplied to a power generator in the fuel cell stack 21.

The instruction signal generator 52 may set the frequency at which the impedance is to be measured while varying the frequency sequentially or at random over the entire low-frequency domain and high-frequency domain. Alternatively, the instruction signal generator 52 may set a specific frequency as the frequency at which the impedance is to be measured depending on the objective of the diagnosis.

The diagnoser 54 acquires the information about the calculated impedance at each frequency, the information about the waveform distortion, and the weight information about the calculated impedance, which are transmitted from the impedance measurement apparatus 40, to diagnose the state of the fuel cell stack 21 based on the acquired information.

For example, when the impedances of multiple frequencies are used, the diagnoser 54 creates a Nyquist diagram using the value of the impedance at each frequency (the average of the impedances of the multiple periods) to perform equivalent circuit fitting.

Figure 5:
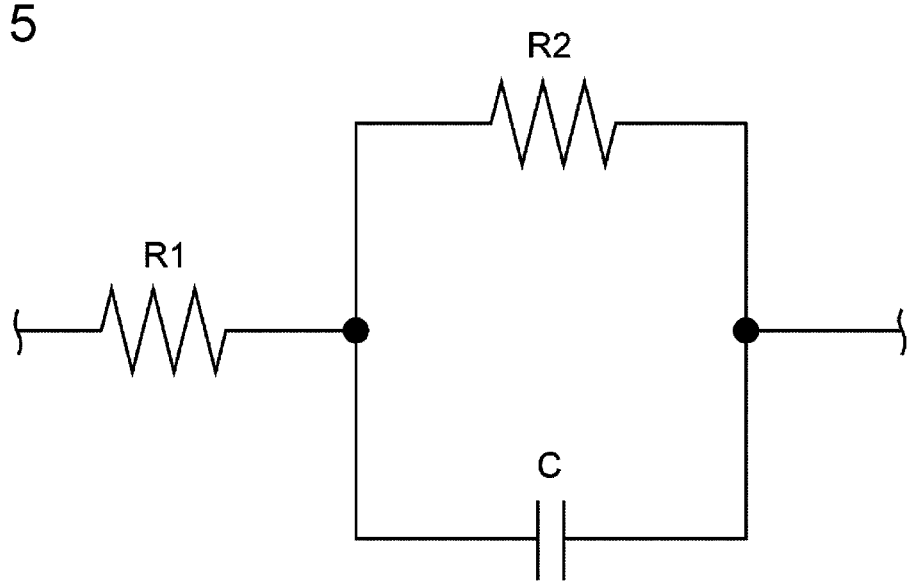
FIG. 5 is a diagram for describing an equivalent circuit model of a fuel cell stack.

The process to measure the impedance of the fuel cell stack 21 is performed using, for example, a method disclosed in JP-A No. 2010-165463. Simply, the impedance Z of the fuel cell stack 21 is capable of being calculated using an equivalent circuit model illustrated in FIG. 5. In the equivalent circuit model illustrated in FIG. 5, the respective parameters: resistance components R1 and R2 and a capacitance component C, which form internal impedance, are combined in series and in parallel. The resistance components R1 and R2 indicate the resistance of a pair of MEAs (MEA resistance) R1 composing each cell in the fuel cell stack 21 and the transfer resistance R2 of the electric charge, respectively. The capacitance component C indicates electrode capacitance.

Figure 6:
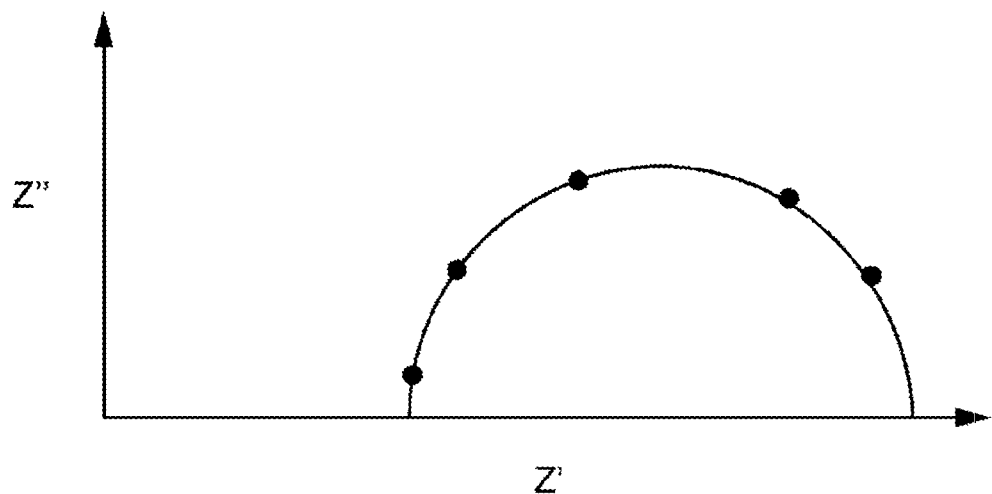
FIG. 6 is a diagram for describing an approximate line representing impedance characteristics.
Figure 7:
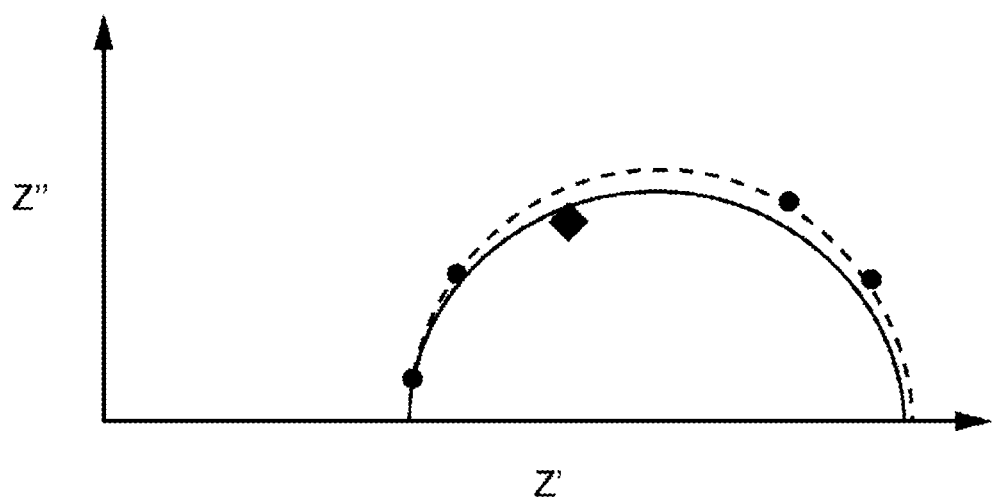
FIG. 7 is a diagram for describing a shift of the approximate line, which is caused by reduction in accuracy of impedance.

FIG. 6 indicates a Nyquist diagram in which the measurement result of the impedance of the fuel cell stack 21 is represented on a complex plane. The Nyquist diagram illustrated in FIG. 6 is acquired by calculating the impedance of the fuel cell stack 21 when the alternating current signal at each frequency is superimposed on the output power from the fuel cell stack 21, plotting the locus of the impedance with respect to variation in frequency on the complex plane, and calculating an approximate line (approximate expression). In this case, if the precision of the impedance measured at a certain frequency is low, an error occurs in the impedance at the frequency illustrated by a black square and the acquired Nyquist diagram is shifted from the actual Nyquist diagram, as illustrated in FIG. 7. When the acquired Nyquist diagram is shifted from the actual Nyquist diagram, the constant of the equivalent circuit illustrated in FIG. 5 (equivalent circuit constant) is not correctly identified and, thus, it is not possible to correctly diagnose the state of the fuel cell stack 21.

However, in the present embodiment, if the waveform distortion is detected, the impedance measurement apparatus 40 calculates the impedance with the data about the corresponding period being excluded. If the frequency and the phase of the measurement target are the same as the frequency and the phase of external noise even when the waveform distortion is not detected, the measurement precision of the impedance is considered to be reduced. Accordingly, in the impedance measurement apparatus 40, the fact that the periods of a large number are excluded due to the waveform distortion is considered as the noise component of a large amount and the weight of the average of the impedances at the corresponding frequency is set to a low value. Consequently, the diagnoser 54 is capable of performing the equivalent circuit fitting in consideration of the set weight to improve the precision of the identification of each equivalent circuit constant. As a result, it is possible to precisely diagnose the wet state and the supply state of the gas in the fuel cell stack 21.

In the diagnosis of the state of the fuel cell stack 21 from the impedance at a single frequency, if the periods of a large number are excluded from the calculation of the impedance, the possibility of including the noise is considered to be high and the measurement precision of the calculated impedance is considered to be low. Accordingly, the diagnoser 54 is capable of determining, based on the weight information, whether control is performed using the value of the impedance at the corresponding frequency as a threshold value or whether the measurement of the impedance is to be performed again.

The auxiliary machine controller 56 performs a process to change the setting of an operating condition of each electronic device connected to the fuel cell stack 21 or the converter 25 based on the weight information transmitted from the impedance measurement apparatus 40. The electronic devices include the fuel cell auxiliary machine 23 and the vehicle auxiliary machine 37. The auxiliary machine controller 56 changes the settings of the operating conditions of the electronic devices connected to the fuel cell stack 21 or the converter 25 based on the weight information in order to suppress an occurrence of the noise that may influence on the output power from the fuel cell stack 21 if the measurement precision of the impedance at a certain frequency is low. The change of the settings of the operating conditions includes stop of the operations of the electronic devices.

The electronic devices the settings of the operating conditions of which are to be changed may include an external device that can cause the electromagnetic wave noise, in addition to the fuel cell auxiliary machine 23 and the vehicle auxiliary machine 37. For example, the setting of the operating condition of a non-contact charge system for charging the secondary battery 31 may be changed. In this case, the auxiliary machine controller 56 is configured to communicate with a control apparatus in the non-contact charge system to output an instruction signal for changing the setting of the operating condition. In the vehicle 1, various electronic devices are grounded to a common body earth and the noise is likely to occur in the output power from the fuel cell stack 21 due to variation in the power consumption in the electronic devices. Accordingly, the electronic devices the settings of the operating conditions of which are to be changed may include the electronic devices connected to the common body earth, in addition to the fuel cell auxiliary machine 23 and the vehicle auxiliary machine 37.

For example, if the weight is lower than or equal to a predetermined threshold value, that is, if the number of the periods excluded in the calculation of the impedance at a certain frequency is greater than or equal to a predetermined threshold value, the auxiliary machine controller 56 changes the setting of the operating condition of at least one of the electronic devices. The threshold value of the weight or the threshold value of the number of the periods is set to an appropriate value depending on the precision of the measurement result of the impedance. The threshold value may be common to all the frequencies or may be set for each frequency.

If the weight is lower than or equal to a predetermined threshold value, the auxiliary machine controller 56 may stop the operations of all the electronic devices that can influence on the waveform of the output power from the fuel cell stack 21. This enables the influence of the electromagnetic waves or the likes caused by the operations of the electronic devices on the waveform of the output power from the fuel cell stack 21 to be reliably reduced.

The auxiliary machine controller 56 may select an electronic device the setting of the operating condition of which is to be changed based on the information about the waveform distortion, transmitted from the impedance measurement apparatus 40. The stop of the operations of the electronic devices that have no influence on the waveform of the output power from the fuel cell stack 21 leads improper limitation of the functions of the vehicle 1. Accordingly, the functions of the vehicle 1 are not excessively restricted by selecting an electronic device causing the waveform distortion of the waveform of the output power from the fuel cell stack 21 to stop the operation of the selected electronic device.

In one example, data about the frequency of the electromagnetic wave noise that can be caused, which is acquired for the electronic device electrically connected to the fuel cell stack 21 or the converter 25, is stored in the storage unit 59. Accordingly, the auxiliary machine controller 56 selects an electronic device the setting of the operating condition of which is to be changed in accordance with the frequency of the noise identified from the waveform including the waveform distortion with reference to the data about the frequency of the electromagnetic wave noise stored in the storage unit 59.

When the auxiliary machine controller 56 has performed the process to change the setting of the operating condition of either of the electronic devices or the settings of the operating conditions of all the electronic devices, the instruction signal generator 52 sets the frequency at which the waveform distortion is detected in the calculation of the impedance as the frequency at which the impedance is to be measured again and transmits the instruction signal to the impedance measurement apparatus 40. This improves the measurement precision of the impedance.

<3. Operations>

The examples of the configurations of the impedance measurement apparatus 40 and the control apparatus 50 are described above. A series of steps of the process to measure the impedance and the process to diagnose the state of the fuel cell stack 21, which are performed by the impedance measurement apparatus 40 and the control apparatus 50, will now be described in detail.

FIG. 8 is a flowchart illustrating an example of a process performed by the impedance measurement apparatus 40 and the control apparatus 50.

Referring to FIG. 8, in Step S11, the instruction signal generator 52 in the control apparatus 50 transmits the instruction signal to measure the impedance to the impedance measurement apparatus 40. In one example, the instruction signal generator 52 sets one or multiple frequencies to be superimposed on the output power from the fuel cell stack 21 depending on the objective of the diagnosis of the fuel cell stack 21 and transmits the one or multiple frequencies that are set to the impedance measurement apparatus 40. The instruction signal generator 52 may set the frequency at which the impedance is to be measured while varying the frequency sequentially or at random over the entire low-frequency domain and high-frequency domain. Alternatively, the instruction signal generator 52 may set a specific frequency as the frequency at which the impedance is to be measured depending on the objective of the diagnosis.

In Step S13, the superimposed signal generator 42 in the impedance measurement apparatus 40 starts a process to superimpose the alternating current at each frequency on the output power from the fuel cell stack 21 based on the instruction signal transmitted from the control apparatus 50. In one example, the superimposed signal generator 42 sets the waveform of the alternating current signal for impedance measurement based on the instruction signal transmitted from the control apparatus 50 and supplies the alternating current signal having the set waveform to the converter 25. The amplitude of the alternating current to be superimposed is set to an appropriate value depending on the specifications of the fuel cell system 20 or the like. The converter 25 operates the switching elements based on the alternating current signal that is input to superimpose the alternating current waveform on the output power from the fuel cell stack 21. A rectangular-wave signal or an M-sequence signal, which is generated through superimposition of signals having the waveforms of multiple frequencies, may be used as the signal for impedance measurement to be superimposed on the output signal from the fuel cell stack 21.

In Step S15, the output power detector 44 in the impedance measurement apparatus 40 detects the output current I and the output voltage V from the fuel cell stack 21 based on the sensor signals supplied from the voltage sensor 81 and the current sensor 83. In one example, the output power detector 44 acquires the sensor signals from the voltage sensor 81 and the current sensor 83 on a predetermined sampling cycle and records the data about the output current I and the output voltage V. The output power detector 44 may perform known signal processing, such as filtering, to the acquired sensor signals. The data about the detected output current I and the detected output voltage V is recorded as data about the alternating current waveform and the alternating current voltage waveform on which the alternating current signal for impedance measurement is superimposed.

In Step S17, the impedance calculator 46 in the impedance measurement apparatus 40 performs a process to determine the waveform distortion for each of the recorded data about the alternating current waveform and the recorded data about the alternating current voltage waveform. In the present embodiment, the impedance calculator 46 determines whether the amplitudes of the output current I and the output voltage V in each period are decreased and whether the shift in phase in the period at the amplitude is caused for each of the alternating current waveform and the alternating current voltage waveform that are detected.

For example, the impedance calculator 46 determines whether each of the alternating current waveform and the alternating current voltage waveform that are detected is different from the alternating current signal transmitted to the converter 25 by the superimposed signal generator 42. If each of the alternating current waveform and the alternating current voltage waveform that are detected is different from the alternating current signal transmitted to the converter 25, the impedance calculator 46 determines that the waveform for impedance measurement is not normally applied. If the amplitudes of the output current I and the output voltage V in each period is lower than a predetermined rate (for example, 0.95) of the magnitude of the amplitude of the alternating current signal, the impedance calculator 46 determines that the amplitude of the period is not the amplitude for which the impedance is capable of being calculated but includes the waveform distortion. The amplitude of each period of the alternating current waveform and the alternating current voltage waveform is capable of being calculated as, for example, the maximum value of the output current I or the output voltage V in each period and the difference between the maximum values.

In addition, the impedance calculator 46 performs the FFT analysis of the alternating current waveform or the alternating current voltage waveform in each period to determine whether a frequency component other than the frequency included in the alternating current signal transmitted to the superimposed signal generator 42 is detected in frequencies around the frequency of the impedance to be calculated (for example, a frequency range ±5% to 10% of the frequency to be measured). If a frequency component other than the frequency included in the alternating current signal transmitted to the converter 25 is detected, the impedance calculator 46 determines that the noise that is not from the converter 25 is included and that the alternating current waveform and the alternating current voltage waveform in the period are not the data with which the impedance is capable of being calculated but include the waveform distortion.

If the waveform distortion is detected, the impedance calculator 46 performs the FFT analysis of the data about the output current I or the output voltage V in each period including the waveform distortion to identify the frequency included in the waveform of the period. This identifies the frequency of the electromagnetic wave noise causing the waveform distortion. The impedance calculator 46 records the detection result and the information about the identified frequency of the noise as the information about the waveform distortion if the decrease in the amplitude or the shift in phase in the period at the amplitude is detected.

In Step S19, the impedance calculator 46 determines whether each of the recorded data about the alternating current waveform and the recorded data about the alternating current voltage waveform is the normal waveform without the waveform distortion. For example, the impedance measurement apparatus 40 determines whether the data about the alternating current waveform and the alternating current voltage waveform of 100 periods is the normal waveform without the waveform distortion. The number of the periods may be set to any value.

If the impedance calculator 46 determines that each of the recorded data about the alternating current waveform and the recorded data about the alternating current voltage waveform is not the normal waveform without the waveform distortion (NO in Step S19), in Step S21, the impedance calculator 46 excludes the data about the period including the waveform distortion from the data for impedance calculation and calculates the weight from the number of the excluded periods. For example, if the data corresponding to five periods including the waveform distortion, among the data corresponding to 100 periods, is excluded, the weight is calculated as 95(=100−5). In other words, the weight is decreased as the number of the excluded periods is increased.

In Step S23, the impedance calculator 46 determines whether the number of the excluded periods is greater than or equal to a predetermined threshold value. The threshold value is set to an appropriate value depending on the degree of permission of the error of the calculated impedance. When the impedance is calculated based on the data corresponding to 100 periods, the threshold value may be set to, for example, 20. However, the threshold value is not specifically limited.

If the impedance calculator 46 determines that the number of the excluded periods is greater than or equal to a predetermined threshold value (YES in Step S23), in Step S25, the impedance calculator 46 transmits the information about the waveform distortion and the information about the weight, which are recorded, to the control apparatus 50.

In Step S27, the auxiliary machine controller 56 in the control apparatus 50 changes the setting of the operating condition of the electronic device connected to the fuel cell stack 21 or the converter 25 based on the information about the waveform distortion and the information about the weight, which are transmitted from the impedance measurement apparatus 40.

In one example, the auxiliary machine controller 56 performs the process to change the setting of the operating condition of the electronic device connected to the fuel cell stack 21 or the converter 25 based on the weight information. For example, if the weight is lower than or equal to a predetermined threshold value, that is, if the number of the excluded periods is greater than or equal to a predetermined threshold value, the auxiliary machine controller 56 selects an electronic device the setting of the operating condition of which is to be changed based on the information about the waveform distortion. In the present embodiment, the auxiliary machine controller 56 identifies the electronic device causing the waveform distortion with reference to the data about the frequency of the electromagnetic wave noise that can occur in each electronic device, which is stored in the storage unit 59. Then, the auxiliary machine controller 56 performs, for example, a process to change the operating point of the identified electronic device to an operating point at which the electromagnetic wave noise does not occur, a process to set the operating state of the electronic device to an operating state in which the waveform distortion is not caused in the waveform of the output power from the fuel cell stack 21, or a process to electrically shut off the electronic device.

For example, the auxiliary machine controller 56 may change the setting of the operating condition so as to suppress the variation in the power consumption in the identified electronic device. This reduces the electromagnetic wave noise occurring in response to the operation of the electronic device. In one example, if the distortion of the alternating current voltage waveform is caused by excessively large variation in the rotation speed of the compressor in the fuel cell auxiliary machine 23, the auxiliary machine controller 56 keeps the rotation speed of the compressor at a constant state. If the electronic device identified as the cause of the waveform distortion is to be electrically shut off, the auxiliary machine controller 56 may shut off a relay provided on a path on which power is supplied to the electronic device.

The auxiliary machine controller 56 may change the settings of the operating conditions of all the electronic devices that can influence on the waveform distortion or may stop all the electronic devices. Alternatively, the auxiliary machine controller 56 may change the setting of the operating condition of part of the electronic devices or may stop part of the electronic devices. When the setting of the operating condition of part of the electronic devices is to be changed, the electronic device the setting of the operating condition of which is to be changed may be changed or the number of the electronic devices the settings of the operating conditions of which are to be changed may be increased if the setting of the operating condition of any electronic device is changed to perform the measurement of the impedance and the accuracy of the calculated impedance is still low.

The auxiliary machine controller 56 may omit the process to select the electronic device the setting of the operating condition of which is to be changed based on the information about the waveform distortion and may change the settings of the operating conditions of all the electronic devices that are set in advance.

After the auxiliary machine controller 56 has changed the setting of the operating condition of either or all of the electronic devices, the process goes back to Step S11. In Step S11, the instruction signal generator 52 sets the frequency at which the waveform distortion is detected in the measurement of the impedance as the frequency at which the impedance is to be measured again and transmits the instruction signal to the impedance measurement apparatus 40. The measurement of the impedance in a state in which the waveform distortion is reduced is performed in the above manner.

If the impedance calculator 46 determines that each of the recorded data about the alternating current waveform and the recorded data about the alternating current voltage waveform is the normal waveform without the waveform distortion (YES in Step S19) or if the impedance calculator 46 determines that the number of the excluded periods is not greater than or equal to a predetermined threshold value (NO in Step S23), in Step S29, the impedance calculator 46 in the impedance measurement apparatus 40 performs the process to calculate the impedance of the fuel cell stack 21 based on the alternating current waveform and the alternating current voltage waveform that are recorded. In one example, the impedance calculator 46 calculates the impedance of each period from the amplitudes of the alternating current waveform and the alternating current voltage waveform and the phase difference between the alternating current waveform and the alternating current voltage waveform and uses the average of the respective impedances as the impedance at the current frequency. At this time, the impedance calculator 46 calculates the impedance based on data other than the data about the periods excluded in Step S21.

In Step S31, the impedance calculator 46 transmits the information about the calculated impedance to the control apparatus 50, with the information about the detected waveform distortion and the information about the weight.

In Step S33, the instruction signal generator 52 in the control apparatus 50 determines whether the impedances are acquired for all the frequencies at which the impedances are to be measured. If the impedance is not acquired for either of the frequencies (NO in Step S33), the process goes back to Step S11. In Step S11, the instruction signal generator 52 sets the frequency at which the impedance is not acquired as the frequency at which the impedance is to be acquired and transmits the instruction signal to the impedance measurement apparatus 40.

If the instruction signal generator 52 determines that the impedances are acquired for all the frequencies (YES in Step S33), in Step S35, the diagnoser 54 identifies the approximate expression of impedance characteristics based on the information about the acquired impedances and the information about the weights. In one example, as illustrated in FIG. 6, the diagnoser 54 plots the locus of the impedance with respect to variation in frequency on the complex plane to calculate the approximate expression (approximate line). The diagnoser 54 calculates the approximate expression in consideration of the weight of the impedance at each frequency.

For example, the diagnoser 54 calculates the approximate expression so that the impedances of frequencies having higher weights have higher degrees of priority of approximation. The frequencies that have the weights lower than or equal to a threshold value and that have the lower accuracies of the impedances may not be included in the calculation of the approximate expression and may be calculated through interpolation. Accordingly, the impedance characteristics are acquired based on the calculation results of the impedances having higher accuracies to improve the precision of the diagnosis result of the state of the fuel cell stack 21.

Known methods may be adopted as the method of diagnosing the state of the fuel cell stack 21 based on the impedance characteristics. In one example, the diagnoser 54 creates the Nyquist diagram based on the impedances measured at multiple frequencies and identifies the equivalent circuit constant so that the equivalent circuit of the fuel cell stack 21, which is prepared in advance, coincides with the Nyquist diagram. Then, the diagnoser 54 determines the state of the fuel cell stack 21 based on information indicating the relationship between the equivalent circuit constant that is prepared in advance and the state of the fuel cell stack 21.

As described above, in the fuel cell system 20 of the present embodiment, in the measurement of the impedance of the fuel cell stack 21 based on the output current I and the output voltage V when the alternating current is superimposed on the output power from the fuel cell stack 21, the impedance is calculated with the data about the periods including the distortion of the alternating current waveform or the alternating current voltage waveform that is output being excluded. Accordingly, it is possible to improve the measurement precision of the impedance. In addition, in the fuel cell system 20 of the present embodiment, if the number of the excluded periods is higher than or equal to a predetermined threshold value, the process to change the setting of the operating condition of the electronic device connected to the fuel cell stack 21 or the converter 25 to measure the impedance is performed. Accordingly, the number of the periods that are excluded due to the waveform distortion is decreased and, thus, it is possible to further improve the measurement precision of the impedance.

Particularly, the fuel cell system 20 of the present embodiment is mounted on the fuel cell vehicle. In the fuel cell system 20 of the present embodiment, the setting of the operating condition of the electronic device connected to a body earth shared with the fuel cell stack 21 is changed to reduce the risk of an occurrence of the noise on the output power from the fuel cell stack 21. Accordingly, it is possible to improve the measurement precision of the impedance.

In addition, in the fuel cell system 20 of the present embodiment, the process to identify the electronic device causing the detected waveform distortion to change the setting of the operating condition is performed. Accordingly, it is possible to efficiently reduce the waveform distortion in the output power from the fuel cell stack 21. In addition, since the operating condition of the electronic device having less influence on the measurement precision of the impedance is not changed, it is possible to prevent the operation of the electronic device from being improperly restricted.

Although the embodiments of the disclosure are described in detail with reference to the attached drawings, the disclosure is not limited to the above examples. It is obvious to the person skilled in the technical field of the disclosure that various modifications and changes are available within the technical idea described in the appended claims. Such modifications and changes are considered to be within the technical scope of the disclosure.

Although the fuel cell stack 21 is exemplified as the measurement target of the impedance in the above embodiments, the measurement target is not limited to the fuel cell stack 21. For example, the technique in the disclosure is applicable even in the measurement of the impedance of the secondary battery 31 provided in the fuel cell system 20. In addition, the technique in the disclosure is applicable to a device capable of supplying power, such as a power generation module or a secondary battery, in another power system other than the fuel cell system 20.

Although a current sweeper (the converter) is exemplified as the electrical load device receiving supply of power in the above embodiments, the electrical load device is not limited to the current sweeper.

The following aspects also belong to the technical scope of the disclosure.

(1) An impedance measurement system including a processor is provided. The processor sets weights that are decreased with the increasing number of excluded periods for each frequency to calculate the approximate expression so that the impedances of frequencies having higher weights have higher degrees of priority of approximation.

(2) A computer program applied to an impedance measurement system that measures impedance of a measurement target capable of supplying power to an electrical load device is provided. The computer program and a recording medium recording the computer program cause one or more processors to perform processes including acquisition of data about output power from the measurement target when an alternating current signal of at least one frequency is superimposed on the output power, calculation of the impedance at the at least one frequency with data about a period including waveform distortion of the output power being excluded, and changing of a setting of an operating condition of an electronic device connected to the measurement target or the electrical load device if the number of the excluded periods at a certain frequency is greater than or equal to a predetermined threshold value to measure the impedance.

The invention claimed is:

1. An impedance measurement system configured to measure impedance of a measurement target capable of supplying power to an electrical load device, the impedance measurement system comprising:
one or more processors; and
one or more memories coupled to the one or more processors so as to be capable of communicating with the one or more processors, wherein
the one or more processors are configured to perform a process comprising
acquiring data about output power from the measurement target when an alternating current signal of at least one frequency is superimposed on the output power,
calculating impedance at the at least one frequency with data about an exclusion period in which waveform distortion of the output power is detected being excluded, and
in a case where how many times the data about the exclusion period is excluded at a certain frequency is greater than or equal to a predetermined threshold value, changing a setting of an operating condition of an electronic device coupled to the measurement target or the electrical load device to measure the impedance.

2. The impedance measurement system according to claim 1, wherein
in the case where how many times the data about the exclusion period is excluded at the certain frequency is greater than or equal to the predetermined threshold value, the processor changes the setting of the operating condition of the electronic device so as to suppress variation in power consumption in the electronic device to measure the impedance.

3. The impedance measurement system according to claim 1, wherein
the one or more processors identify a frequency of noise included in the data about the exclusion period which is acquired while the alternating current signal is superimposed, to select the electronic device the setting of the operating condition of which is to be changed in accordance with the frequency of the noise.

4. The impedance measurement system according to claim 1, wherein
the at least one frequency comprises multiple frequencies, and
the one or more processors acquire data about the output power when the alternating current signals of each of the frequencies is superimposed on the output power from the measurement target, sets a weight for the impedance at each of the frequencies based on how many times the data about the exclusion period is excluded at each of the frequencies to calculate an approximate expression indicating relationship between each of the frequencies and the impedance, and diagnoses a state of the measurement target based on the approximate expression.

5. An impedance measurement system configured to measure impedance of a measurement target capable of supplying power to an electrical load device based on output power from the measurement target, the output power being measured when an alternating current signal of at least one frequency is superimposed on the output power, the impedance measurement system comprising:
a superimposed signal generator configured to superimpose the alternating current signal;
an impedance calculator configured to calculate the impedance of the at least one frequency with data about an exclusion period in which waveform distortion of the output power is detected being excluded; and
an auxiliary machine controller configured to, in a case where how many times the data about the exclusion period is excluded at a certain frequency is greater than or equal to a predetermined threshold value, change a setting of an operating condition of an electronic device coupled to the measurement target or the electrical load device.

\* \* \* \* \*